(12) United States Patent
Barfield, Jr. et al.

(10) Patent No.: US 10,197,631 B2
(45) Date of Patent: Feb. 5, 2019

(54) SYSTEMS AND METHODS FOR DETERMINING VEHICLE BATTERY HEALTH

(71) Applicant: Verizon Patent and Licensing Inc., Arlington, VA (US)

(72) Inventors: James Ronald Barfield, Jr., Atlanta, GA (US); Stephen Christopher Welch, Atlanta, GA (US); Thomas Steven Taylor, Atlanta, GA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 303 days.

(21) Appl. No.: 14/727,238

(22) Filed: Jun. 1, 2015

(65) Prior Publication Data

US 2016/0349330 A1 Dec. 1, 2016

(51) Int. Cl.
*G07C 5/00* (2006.01)
*G01R 31/36* (2006.01)
*G07C 5/08* (2006.01)

(52) U.S. Cl.
CPC ......... *G01R 31/3648* (2013.01); *G07C 5/008* (2013.01); *G07C 5/085* (2013.01); *G07C 5/0816* (2013.01)

(58) Field of Classification Search
CPC .. G01R 31/3648; G07C 5/0816; G07C 5/085; G07C 5/008
See application file for complete search history.

(56) References Cited

U.S. PATENT DOCUMENTS

| 4,912,416 | A | 3/1990 | Champlin | |
|---|---|---|---|---|
| 5,572,136 | A | 11/1996 | Champlin | |
| 5,585,728 | A | 12/1996 | Champlin | |
| 5,757,192 | A | 5/1998 | McShane et al. | |
| 6,534,992 | B2 | 3/2003 | Meissner et al. | |
| 8,296,035 | B2 | 10/2012 | Manokar et al. | |
| 2010/0026306 | A1* | 2/2010 | Zhang | G08C 17/00 324/426 |
| 2011/0043355 | A1* | 2/2011 | Chander | B60L 11/1818 340/455 |
| 2011/0224928 | A1* | 9/2011 | Lin | G01R 31/3651 702/63 |

(Continued)

OTHER PUBLICATIONS

I. Buchmann, "BU-901: Difficulties with Testing Batteries," Battery University, (available at http://batteryuniversity.com/learn/article/difficulties_with_testing_batteries, visited Jun. 1, 2015).

*Primary Examiner* — Khamdan N. Alrobaie

(57) ABSTRACT

Techniques described herein may be used to provide a driver of a vehicle with an accurate assessment of the remaining life of the vehicle battery. An on-board device may collect information from one or more sensors or devices within the vehicle. The information may be processed to generate a data set that accurately describes the current status and operating conditions of the battery. The data set may be used to evaluate the health of the battery and make predictions regarding the future performance of the battery, which may be communicated to the driver of the vehicle. Machine-learning techniques may be implemented to improve upon methodologies to evaluate the health of the battery and make predictions regarding battery performance.

20 Claims, 9 Drawing Sheets

(56) References Cited

U.S. PATENT DOCUMENTS

| | | | | |
|---|---|---|---|---|
| 2011/0264318 A1* | 10/2011 | Laforge | ............... | G07C 5/008 |
| | | | | 701/22 |
| 2012/0029764 A1* | 2/2012 | Payne | ............... | G07C 5/0866 |
| | | | | 701/33.4 |
| 2012/0089442 A1* | 4/2012 | Olsson | ............... | G06Q 30/0207 |
| | | | | 705/14.1 |
| 2013/0262067 A1* | 10/2013 | Zhang | ............... | G01R 31/3651 |
| | | | | 703/8 |
| 2014/0019001 A1* | 1/2014 | Nishizawa | ............ | H01M 10/48 |
| | | | | 701/31.9 |
| 2015/0039391 A1* | 2/2015 | Hershkovitz | ......... | G06Q 10/04 |
| | | | | 705/7.31 |
| 2015/0213555 A1* | 7/2015 | Barfield, Jr. | ........... | G06Q 40/08 |
| | | | | 705/4 |
| 2015/0326037 A1* | 11/2015 | Borhan | ............... | G01R 31/36 |
| | | | | 320/162 |
| 2016/0041231 A1* | 2/2016 | Lee | ................. | G01R 31/3679 |
| | | | | 702/63 |

* cited by examiner

SYSTEMS AND METHODS FOR DETERMINING VEHICLE BATTERY HEALTH

BACKGROUND

Automotive battery failures account for a large number of all automotive failures every year. Many of the causes of automotive battery failures are poorly understood. As a result, it can be difficult to accurately determine the health of a vehicle battery, which may include the remaining life of the battery.

BRIEF DESCRIPTION OF THE DRAWINGS

Embodiments of the present invention will be readily understood by the following detailed description in conjunction with the accompanying drawings. To facilitate this description, like reference numerals may designate like structural elements. Embodiments of the invention are illustrated by way of example and not by way of limitation in the figures of the accompanying drawings.

DETAILED DESCRIPTION OF PREFERRED EMBODIMENTS

The following detailed description refers to the accompanying drawings. The same reference numbers in different drawings may identify the same or similar elements. It is to be understood that other embodiments may be utilized and structural or logical changes may be made without departing from the scope of the present disclosure. Therefore, the following detailed description is not to be taken in a limiting sense, and the scope of embodiments in accordance with the present invention is defined by the appended claims and their equivalents.

Techniques described herein may be used to provide a driver of a vehicle with an accurate assessment of the health of a vehicle battery, which may include an indication of the remaining life of the vehicle battery. For instance, a telematics device (e.g., an on-board computing device installed in the vehicle) may collect information, relevant to evaluating the health of a vehicle battery, from one or more sensors or devices within the vehicle (e.g., an ohmic tester that measures the effective resistance of the battery, a diagnostics device that monitors internal systems and ongoing operations of the vehicle, etc.). The information may be processed (e.g., by normalizing the information, removing statistical outliers, etc.) in order to generate a data set that describes the current status and conditions relating to the battery.

The data set may be sent to an intelligence system that may use the data set to evaluate the health of the battery, make predictions regarding the future performance of the battery, and communicate the health of the battery to the driver of the vehicle. The intelligence system may implement machine-learning techniques that enable the intelligence system to improve upon previous attempts to ascertain the health of the battery and make predictions regarding the future performance of the battery (e.g., by comparing battery health estimates and predictions with future results and by altering subsequent battery analyses accordingly). As such, systems and methods described herein may be used to accurately determine the health of a vehicle battery, communicate the health of the vehicle battery to a driver of the vehicle, and dynamically improve the methodologies used for determining vehicle battery health.

Figure 1:
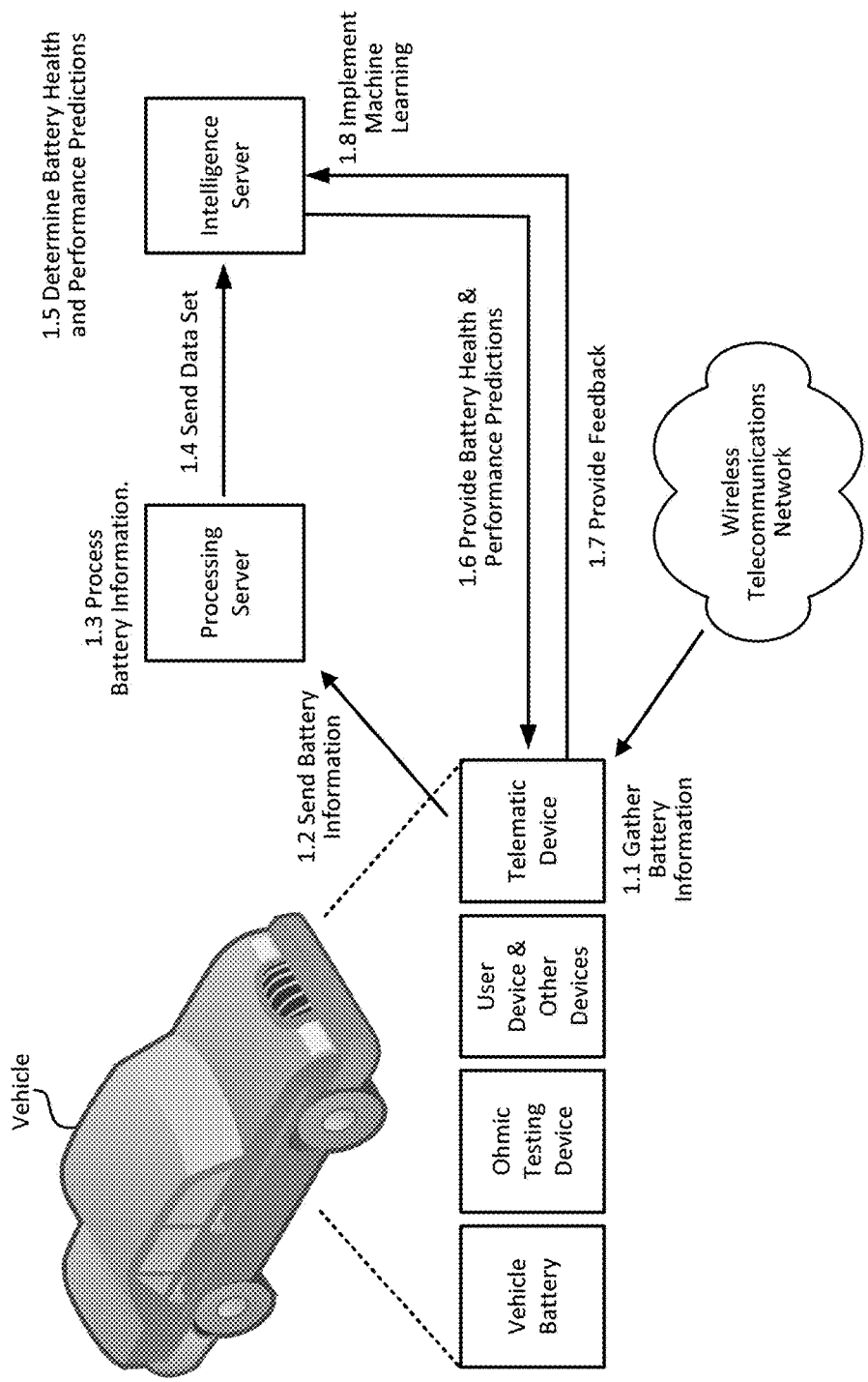
FIG. 1 illustrates an example overview of an implementation described herein.

FIG. 1 illustrates an example overview of an implementation described herein. As shown in FIG. 1, a vehicle may include a telematics device (e.g., a computing device installed within the vehicle that is capable of gathering information, relating to battery health, from various sources (at 1.1). For instance, the telematics device may obtain ohmic testing information (e.g., measurements of electrical resistance and impedance of the vehicle battery) from an ohmic testing device connected to the vehicle battery, or be installed within the battery. Alternatively, the ohmic testing device may be a re-usable, re-installable part of the battery that is re-used when switching from an old battery to a new battery. The telematics device may also collect information from other devices within the vehicle, such as a vehicle diagnostics device that monitors operating conditions within the vehicle, a geographic location device that monitors the geographic location of the vehicle, a temperature device that monitors the temperature in or around the battery, a user device of the driver that monitors barometric pressure and vehicle acceleration, etc. The telematics device may also collect information from a wireless telecommunications network, such as service records for the vehicle, performance records of the vehicle, make and model of the vehicle and/or vehicle battery, etc.

The telematics device may communicate the collected information to a processing server (at 1.2). The processing server may process some or all the information (e.g., by normalizing the information, removing statistical outliers, converting information from one type to another, combining two or more types of information, etc.) to generate a data set that represents the condition of the vehicle, vehicle battery, and the environment in which the vehicle battery is operating (at 1.3). The processing server may send the data set to an intelligence server (at 1.4).

The intelligence server may use the data set to evaluate the current health of the battery (1.5). For instance, the intelligence server may determine the remaining life of the battery and make predictions regarding the future performance of the vehicle battery (e.g., predict future voltage measurements, resistance measurements, the remaining life of the battery, etc.). The intelligence server may communicate the health of the battery and the performance predictions to the telematics device (and/or the user device) in order to inform the driver of the vehicle regarding the health of the battery (at 1.6). Additionally, at some point, the telematics device may provide feedback to the intelligence system regarding the battery health and performance predictions (e.g., whether the battery health and performance predictions were accurate) (at 1.7). The intelligence system may implement self-learning techniques based on the feedback to enable the intelligence system to improve the previous techniques used to determine the health of the battery and make performance predictions (at 1.8).

Additionally, the determination of battery health may be used to determine electric car range or the computed miles-per-gallon (MPG) of hybrids as a function of the ohmic measurement of each battery cell or battery. A single ohmic testing device may be used for multiple batteries; logic may be applied to switch the circuit such that the ohmic measurement can be applied to one battery at a time eliminating the need for more than one circuit when measuring multiple batteries.

Figure 2:
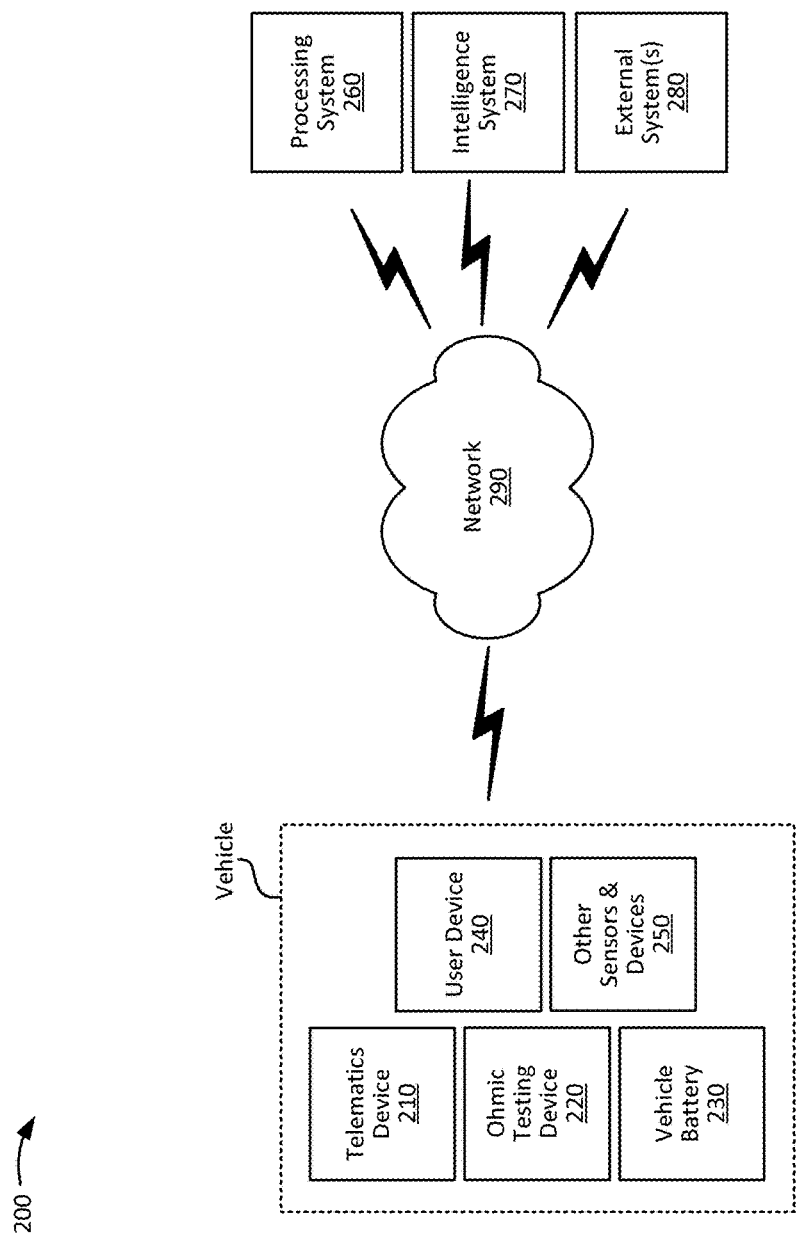
FIG. 2 is a diagram of an example environment in which systems and/or methods described herein may be implemented.

FIG. 2 is a diagram of an example environment 200 in which systems and/or methods described herein may be implemented. Environment 200 may include a vehicle that includes telematics device 210, ohmic testing device 220, vehicle battery 230, user device 240, and other sensors & devices 250. Environment 200 may also include processing system 260, intelligence system 270, external system 280, and network 290. In some implementations, one or more of the processes described herein may be performed locally at a device installed in the vehicle (e.g., without the need of a network or network device.

Telematics device 210 may include a computing and communication device that collects information relating to vehicle battery 230 and communicates the information to processing system 260. For instance, telematics device 210 may communicate with devices and sensors in and around the vehicle. Examples of such sensors and devices may include ohmic testing device 220, user device 240, and other sensors & devices 250 (e.g., an on-board diagnostics (OBD) device, an engine control unit, a transmission electronic control unit (ECU), a cruise control ECU, a battery and recharging system ECU (e.g., for hybrid or electric vehicles), a geographic location unit (e.g., a Global Positioning System (GPS) device), an emissions sensor or device, alternator sensors or other electrical system sensors, etc).

Telematics device 210 may communicate with the devices and sensors via an on-board device II (OBD-II) port in the vehicle, a controller area network (CAN) bus of the vehicle, and/or a wireless interface. Additionally, one or more protocols may be used to enable this communication, such as a Society of Automotive Engineers (SAE) protocol, an International Organization for Standardization (IOS) protocol, etc. Telematics device 210 may also communicate, via a wireless interface, with systems and devices that are external to the vehicle (e.g., processing system 260, intelligence system 270, and external system 280).

Telematics device 210 may communicate with the devices and sensors of the vehicle, and/or systems and devices that are external to the vehicle, in order to collect a variety of information that may relate to determining the health of vehicle battery 230. As will be discussed in greater detail below, examples of such information may include measurements of the voltage or current of vehicle battery 230, an operational status of the vehicle (e.g., whether the vehicle engine is running, whether the vehicle is in an idle mode, whether the vehicle is moving, etc.), ohmic measurements of vehicle battery 230, environmental information (e.g., temperature, humidity, etc.), and more.

Telematics device 210 may communicate the information to processing system 260 in order for the information to be processed into a data set upon which the health of vehicle battery 230 may be determined by intelligence system 270. In some implementations, some or all of the information may be processed by telematics device 210 instead of processing system 260. In some implementations, telematics device 210 may also receive information from intelligence system 270 regarding the determined health of vehicle battery 230 and may provide the information to a driver of the vehicle (e.g., via a multimedia system installed in the vehicle or user device 240).

Additionally, telematics device 210 may receive performance predictions, from processing system 260, regarding vehicle battery 230 and may provide feedback information to intelligence system 260 regarding the performance predictions. Telematics device 210 may collect, store, transmit, and receive information according to one or more communication strategies, which may be based on available bandwidth, system complexity (e.g., how many sensors and devices are involved), requests from processing system 260, requests from intelligence system 270, preselected schedules (that may be different for different types of information, under different conditions, at different times of day, etc.), dynamic or real-time adjustments to a preselected schedule, etc.

Ohmic testing device 220 may include an electronic device capable of determining the internal resistance or impedance of vehicle battery 230. Ohmic testing device 220 may include an arrangement of circuits that are connected to vehicle battery 230 in one or more ways. For instance, ohmic testing device 220 may be an internal component of vehicle battery 230, may be physically connected to the exterior of vehicle battery 230, or may be positioned at an entirely different location within the vehicle. Ohmic testing device 220 may be built into the vehicle or installed as an aftermarket component. In some implementations, ohmic testing device 220 may be connected to vehicle battery 230 in such a way as to enable ohmic testing device 220 to be easily detached from vehicle battery 230 and attached to another vehicle battery (e.g., to a replacement battery or to a battery of another vehicle). For example, ohmic testing device 220 may be implemented as a relatively small and portable device that is designed to be directly connected to the terminals of a vehicle battery and that wirelessly communicates measured values using short range wireless technologies. The wireless communication of measured values may transmit to a stationary device outside the vehicle, home, or a cellular phone. Additionally or alternatively, a smartphone, a stationary device, or other device may encapsulate elements 210, 230, 240, 250, 290, 260, 270, and 280 in addition to the ohmic testing device and a short range wireless transmission of data.

Vehicle battery 230 may include an electrical power source for powering one or more systems of the vehicle. In some implementations, vehicle battery 230 may include a lead-acid battery and/or another type of battery. Vehicle battery 230 may be part of a combustion engine vehicle, a hybrid vehicle, an electric vehicle, boat, watercraft, aircraft, or another type of vehicle.

User device 230 may include a portable computing and communication device, such as a personal digital assistant (PDA), a smart phone, a cellular phone, a laptop computer with connectivity to a wireless telecommunications network, a tablet computer, etc. In some implementations, user device 230 may belong to a driver of the vehicle. User device 230 may connect, through a radio link, to network 290. In some implementations, user device 230 may provide user information, geographic location information, acceleration/deceleration, barometric measurements, or other types of information to telematics device 210. In some implementations, some or all of the information described above as being collected by telematics device 210 and communicated to processing system 260 may be collected and communicated to processing system 260 by user device 230.

Processing system 260 may include one or more computation and communication devices that act to receive information from telematics device 210 and process the information into a data set that represents the condition of the vehicle, vehicle battery 230, and the environment in which vehicle battery 230 is operating. Processing the information may include normalizing the information (e.g., subtracting the mean and dividing by the standard deviation), removing statistical outliers, converting sensor signals into specific numerical values or ranges, identifying and removing anomalies (e.g., information indicative of a sensor malfunction), converting information from one type of unit of measurement to another, and making determinations based on a comparison of information and pre-selected thresholds, triggers, or other conditions. In some implementations, processing system 260 may also process the information by identifying or categorizing the information. For instance, processing system 260 may categorize information as the make and model of vehicle battery 230, identify information as ohmic testing data, weather information (e.g., humidity, temperature, etc.), vehicle operational status information, geographical location information, and more. In some implementations, some or all of the information may actually be processed by another device, such as telematics device 210, user device 230, or intelligence system 270.

Intelligence system 270 may include one or more computation and communication devices that act to receive data sets corresponding to vehicle battery 230, determine the current health of vehicle battery 230 (e.g., the remaining battery charge life, the length of time the battery will last, the number of charge cycles the battery will last, or the likelihood that the battery will fail in the near future), and predict the future performance of vehicle battery 230 (e.g., future voltage measurements, resistance measurements, etc.). In some implementations, intelligence system 270 may communicate the health of vehicle battery 230 to a driver of the vehicle via telematics device 210 or user device 240. Further, the health of the battery may be additionally or alternatively communicated to other relevant parties, for example, the owner or operator of a vehicle fleet, a vehicle owner, an automotive dealership, or battery manufacturer. In some implementations, intelligence system 270 may implement self-learning techniques that enable the intelligence system to improve upon previous methodologies used to determine the health of vehicle battery 230 (e.g., by comparing previous predictions with subsequent results and altering prediction methodologies accordingly). Examples of such self-learning techniques may include Artificial Neural Network (ANN), Gaussian Processes Models, Support Vector Machines, Naïve Bayes Classifiers, K-Nearest Neighbor algorithms, Kernel methods, K-Means Clustering, Autoencoders (or Sparse Coding), and more. Additionally, intelligence system 270 may include historical information corresponding to historical data sets and information relating to the vehicle and/or other vehicles.

External system 280 may include one or more computation and communication devices that act to provide information to telematics device 210, processing system 260, and/or intelligence system 270. For example, external system 280 may include a server at an automotive service station that stores records of work and repairs done on the vehicle, vehicle battery 230, and/or other sensors & devices 250. As another example, external system 280 may include a geographic tracking system (e.g., a GPS system) for monitoring the geographical location of the vehicle and recording trips made by the vehicle.

In yet another example, external system 280 may include a server operated by an organization that tracks and forecasts environmental conditions, such as temperature, humidity, etc. In another example, external system 280 may include a server operated by an organization that handles emergency calls (E-calls), service calls (S-calls), etc., regarding accidents and failures that have occurred to the vehicle. The collected and information stored by external system 280 may be provided to telematics device 210, processing system 260, and/or intelligence system 270 in order to improve the quantity and quality of information made available to accurately determine vehicle battery health.

Network 290 may include one or more wired and/or wireless networks. For example, network 270 may include a cellular network (e.g., a second generation (2G) network, a third generation (3G) network, a fourth generation (4G) network, a fifth generation (5G) network, a LTE network, a GSM network, a code division multiple access (CDMA) network, an evolution-data optimized (EVDO) network, or the like), a public land mobile network (PLMN), and/or another network. Additionally, or alternatively, network 270 may include a local area network (LAN), a wireless LAN (WLAN), a wide area network (WAN), a metropolitan network (MAN), the Public Switched Telephone Network (PSTN), an ad hoc network, a managed IP network, a virtual private network (VPN), an intranet, the Internet, a fiber optic-based network, and/or a combination of these or other types of networks.

Figure 3:
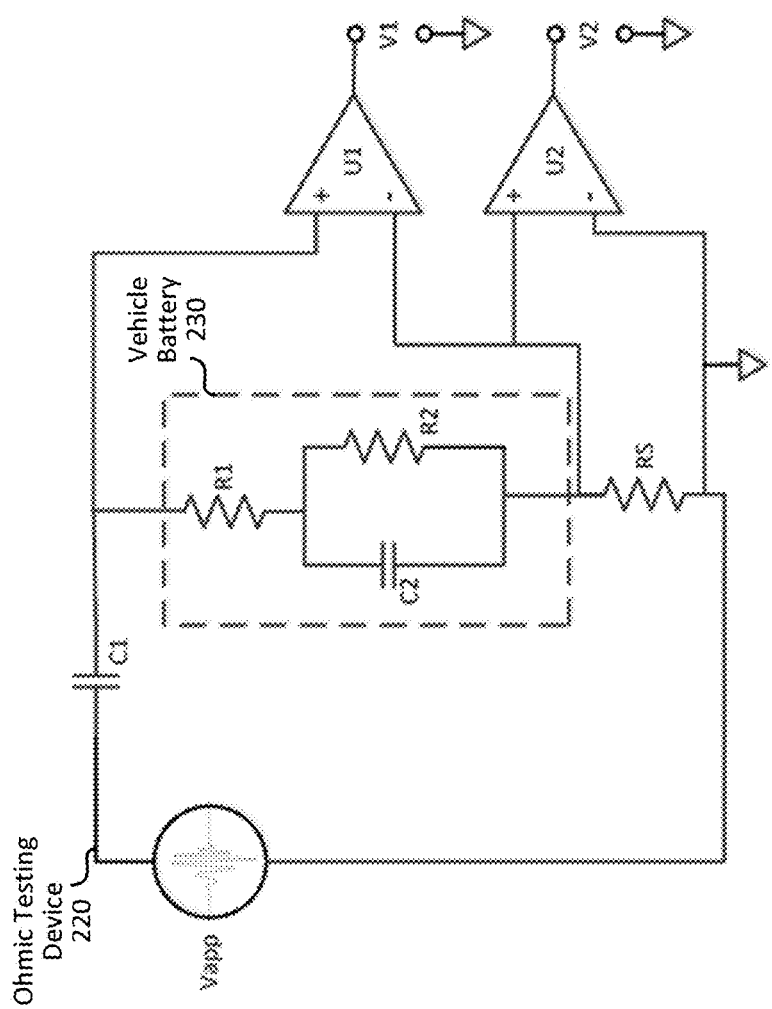
FIG. 3 is a circuit diagram of an example ohmic testing device and vehicle battery.

FIG. 3 is a circuit diagram of an example implementation of ohmic testing device 220 connected to vehicle battery 230. As shown, ohmic testing device 220 may include differential amplifier U1, differential amplifier U2, capacitor C1, voltage output V1, voltage output V2, and shunt resistor RS. Vehicle battery 230 may be modeled as series resistor R1 and a parallel RC circuit (resistor R2 and capacitor C2). As taking ohmic measurements of batteries involves known technologies and techniques, only a brief description of FIG. 3 is provided herein.

A voltage (Vapp) may be applied, via capacitor C1, to terminals of vehicle battery 230 in order to induce a current. Shunt resistor RS may be used to measure the current leaving vehicle battery 230. Differential amplifiers U1 and U2 may measure the voltage across vehicle battery 230 and shunt resistor RS, and may be capacitively coupled to block direct current (DC) signals. Voltage outputs V1 and V2 may be measured (e.g., via analog to digital converters (ADC)) as the outputs of ohmic testing device 220.

The modeled resistance (corresponding to resistors R1 and R2) and capacitance (corresponding to capacitor C2) of vehicle battery 230 may be estimated from a combination of voltage outputs V1 and V2 and the applied voltage signal (Vapp). The impedance of vehicle battery 230 may be determined based on the vehicle battery resistance by applying Ohm's Law to the estimated resistance and capacitance of vehicle battery 230. In some implementations, the voltage signal (Vapp) may be modified and/or applied at different times and/or at different levels in order to accurately determine the resistance, capacitance, and impedance of vehicle battery 230. Alternatively or additionally, a specific test current may be applied to battery, rather than a test voltage.

Figure 4:
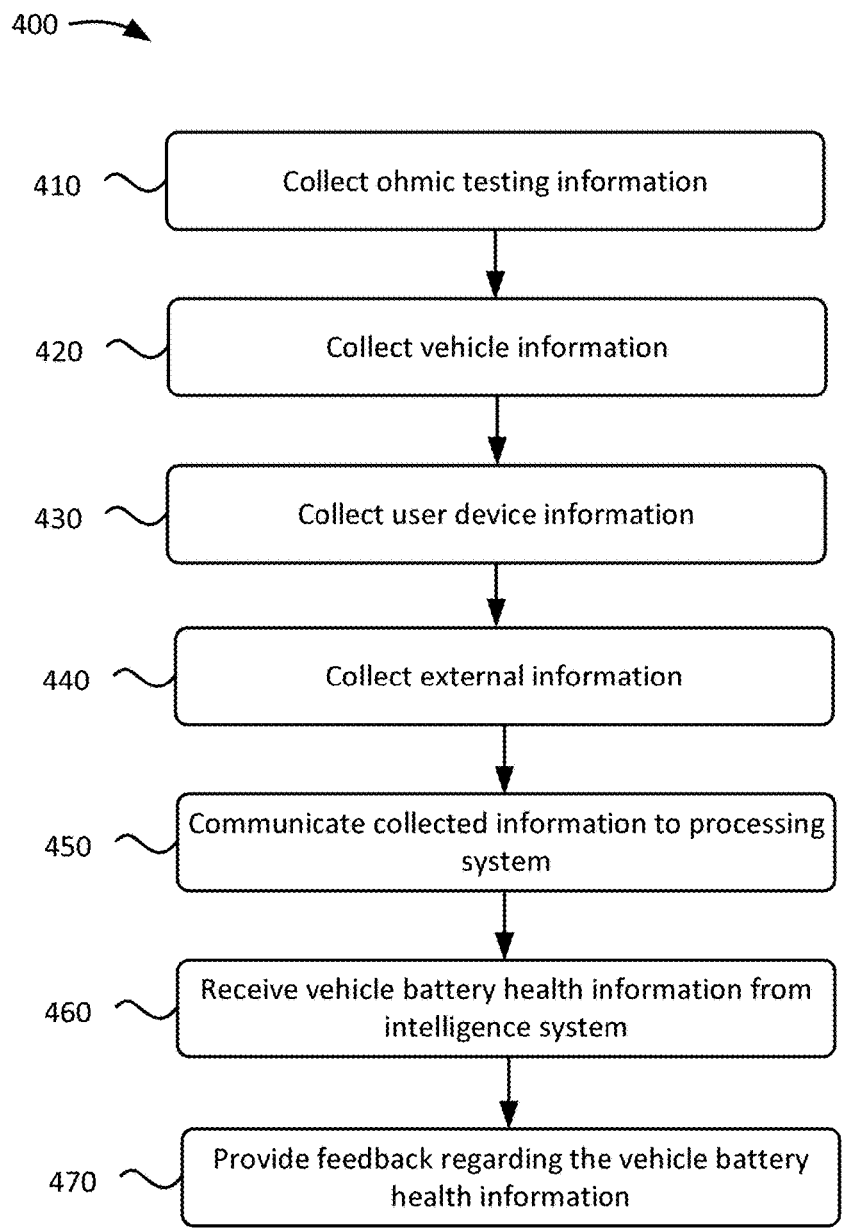
FIG. 4 is a flow chart illustrating an example process for collecting information relative to the health of a vehicle battery.

FIG. 4 is a flow chart illustrating an example process 400 for collecting information relative to the health of vehicle battery 230. Process 400 may be implemented by telematics device 210. However, in some implementations, one or more operations of process 400 may be performed by another device, such as user device 240.

As shown, process 400 may include collecting ohmic testing information (block 410). For example, telematics device 210 may collect ohmic testing information from ohmic testing device 220. The ohmic testing information may include resistance data, capacitance data, voltage data, or other information relating to the health of vehicle battery 230. In some implementations, the information collected from ohmic testing device 220 may be used by telematics device 210 to calculate the impedance of vehicle battery 230. In some implementations, the impedance of vehicle battery 230 may be calculated by another device. Telematics device 210 may collect the information from ohmic testing device 220 on a per-request basis and/or according to a pre-selected schedule. Additionally, telematics device 210 may associated the ohmic testing information with other information, such as a timestamp and an operating condition of the vehicle (e.g., whether the vehicle is off, idling, or moving).

Process 400 may include collecting vehicle information (block 420). For instance, telematics device 210 may collect vehicle information from one or more sensors or electronic devices installed in the vehicle. For instance, telematics device 210 may collect diagnostics data (e.g., diagnostic trouble codes (DTCs) indicating problems within the vehicle), engine performance data from an engine controller, automobile information (e.g., a Vehicle Identification Number (VIN), vehicle body type, make, model, etc.), instrument data (e.g., vehicle speed, engine revolutions per minute (RPMs), engine load, etc.), climate information (e.g., temperature, humidity, etc.) in and around vehicle battery 230, and more.

Additionally, telematics device 210 may collect driving style data (e.g., acceleration data, deceleration data, quantity/frequency of stops, starts, or turns, etc.), emissions information, reliability information (e.g., from DTCs, engine data, etc.), and miles per gallon. Additional examples of vehicle information may include time based changes in voltage or current while the vehicle is off, voltage or current readings while the vehicle is on, the total number of vehicle starts for a designated battery, the age of the battery, statistical operation on battery voltage or current readings. The vehicle information collected by telematics device 210 may include timing information (e.g., a timestamp).

Process 400 may include collecting user device information (block 440). For instance, telematics device 210 may collect barometric pressure information, humidity information, location information, acceleration information, and gyroscopic information. Additionally, telematics device 210 may collect information relating to an identity of the user, which may later be used to, for example, project battery health based on historic driving data (e.g., driving habits) associated with the driver. Wi-Fi or Bluetooth technology may be used to determine that the device is in the vehicle and subsequently may be used to collect information.

Process 400 may include collecting external information (block 440). For instance, telematics device 210 may collect information from a network that is external to the vehicle, such as a wireless telecommunications network. Examples of such information may include a geographical location of the vehicle, weather information (e.g., temperature, humidity, weather forecasts, etc.), a current travel pattern of the vehicle, historical travel patterns of the vehicle and/or driver of the vehicle, durations of trips taken with vehicle battery 230 in use, current trip millage, etc. Additional examples of external information may include recall information regarding the vehicle or a part of the vehicle (e.g., a recall issued for the type of battery being used by the vehicle), service records regarding the vehicle (e.g., when the vehicle was last serviced, services provided to the vehicle (e.g., a battery alteration or replacement and/or alternator alteration or replacement), etc.).

Process 400 may include communicating the collected information to processing system 260 (block 450). For instance, telematics device 210 may send the ohmic testing information, the vehicle information, the user device information, and the external information to processing system 260 via a wireless telecommunications network. In some implementations, the collected information may be communicated to processing system 260 according to a pre-selected schedule, in response to a trigger (e.g., the vehicle being turned on, the vehicle transitioning operational states, in response to a measured threshold (e.g., a threshold voltage level)), upon request (e.g., from processing system 260 or intelligence system 270), etc.

Process 400 may include receiving battery health information from intelligence system 270 (block 460). For instance, telematics device 210 may receive information, from intelligence system 270, that indicates the remaining battery life of vehicle battery 230. In some implementations, the battery health information may be provided to a driver of the vehicle via a media console within the vehicle or user device 240. In some implementations, the battery health information may also include predicted performance levels of vehicle battery 230, such as predicted voltage measurements, usage information (e.g., how often vehicle battery 230 will be in use or how long the battery will be in use for a particular driving session), etc.

Process 400 may include providing feedback regarding the vehicle battery health information (block 470). For example, based on the vehicle battery health information received from intelligence system 270, telematics device 210 may monitor vehicle battery 230 (and/or other portions of the vehicle pertaining to the vehicle battery health information) to determine whether the predictions included in the vehicle battery health information are accurate. In response to this determination, telematics device 210 may communicate feedback information to intelligence system 270 in order to inform intelligence system 270 about the accuracy of the vehicle battery health information received from intelligence system 270. As discussed below in more detail, intelligence system 270 may use the feedback information to enhance evaluative and analytical processes used to generate the vehicle battery health information.

Figure 5:
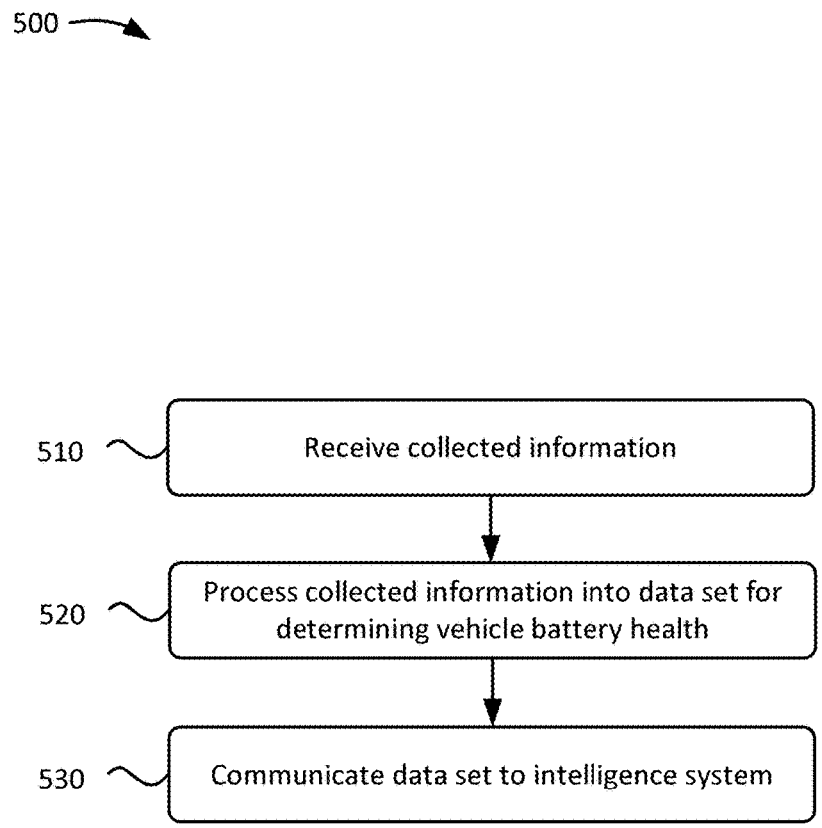
FIG. 5 is a flow chart illustrating an example process for creating a data set for determining the health of a vehicle battery.

FIG. 5 is a flow chart illustrating an example process 500 for creating a data set for determining the health of vehicle battery 230. Process 500 may be implemented by processing system 260. However, in some implementations, one or more operations of process 500 may be performed by another device, such as telematics device 210.

Process 500 may include receiving collected information (block 510). For instance, processing system 260 may receive ohmic testing information, vehicle information, user device information, and external information from telematics device 210. In some implementations, some or all of the collected information may be received by processing system 260 according to a pre-selected schedule, in response to a trigger (e.g., the vehicle being turned on, the vehicle transitioning operational states, in response to a measured threshold (e.g., a threshold voltage level), and/or upon request (e.g., a request from processing system 260 to telematics device 210)). Processing system 260 may receive the collected information from telematics device 210 via a wireless telecommunications network.

Process 500 may include processing the collected information into a data set for determining vehicle battery health (block 520). For instance, processing system 260 may normalize the collected information, remove statistical outliers, convert sensor signals into specific numerical values, detect anomalies (e.g., information indicative with a sensor malfunction), convert information from one data type to another data type, and make determinations based on a comparison of the collected information and pre-selected thresholds, triggers, or other conditions. Processing system 260 may also process the collected information by identifying or categorizing the collected information. For instance, processing system 260 may categorize collected information as the make and model of vehicle battery 230, identify collected information as ohmic testing data, weather information, vehicle operational status information, geographical location information, etc. In some implementations, processing system 260 may pair certain types of the collected information to other types of collected information. Additionally or alternatively, the processing system 260 may categorize collected information based on the make, model, and/or year of the vehicle. Specifically, if no battery information in available, then relative battery information can be determined from the make, model, and/or year of the vehicle (often determined form the vehicle identification number (VIN)).

Figure 6:
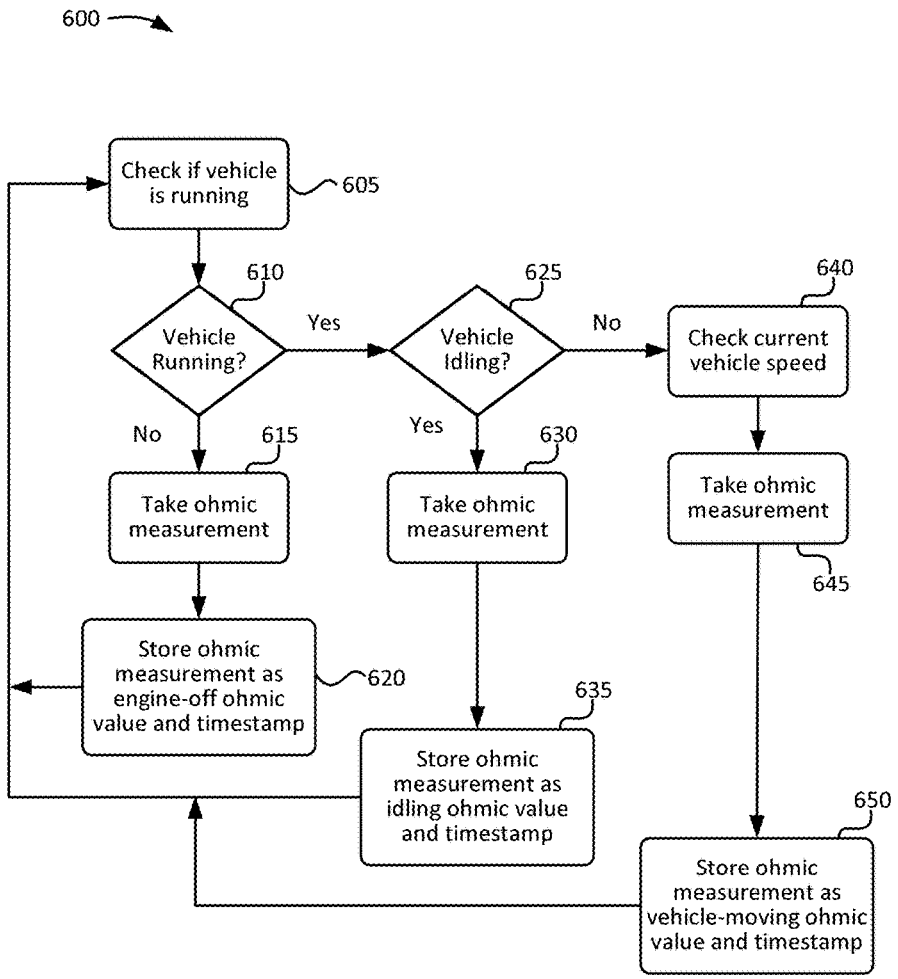
FIG. 6 is a flow chart illustrating an example process for creating a data set by pairing certain types of collected information with other types of information.

FIG. 6 is a flow chart illustrating an example process 600 for processing collected information by pairing certain types of information with other types of information. In some implementations, process 600 may be performed by processing system 260. However, in other implementations, process 600 may be performed by another device, such as telematics device 210 or intelligence system 270.

As shown, process 600 may include checking if the vehicle is running (bock 605). For instance, processing system 260 may determine whether a vehicle is running based on collected information (e.g., RPMs) received from telematics device 210. When the vehicle is not running (block 610, No), process 300 may include taking an ohmic measurement of vehicle battery 230 (block 615). For instance, processing system 260 may send a request to telematics device 210 for ohmic measurements of vehicle battery 230, and telematics device 210 may respond by providing ohmic measurement information to processing system 260.

In some implementations, processing system 260 may already have current ohmic measurement information of battery device 210 based on collected information already received from telematics device 210. Process 600 may include storing the ohmic measurement as an engine-off ohmic value along with a timestamp (block 620). For example, when the vehicle is not running, processing system 260 may combine the ohmic measurement information with vehicle operational status information (e.g., "engine off") and a timestamp in order to, for example, create an accurate picture of the time and context in which the ohmic measurement information was taken.

When the vehicle is running (block 610, Yes), process 600 may include determining whether the vehicle is idling (block 625). For instance, processing system 260 may determine that the vehicle is idling based on the collected information from telematics device 210. When the vehicle is idling (block 625, Yes), process 600 may include taking an ohmic measurement of vehicle battery 230 (block 630) and storing the ohmic measurement as an idling ohmic value along with a timestamp (block 635). For instance, when the vehicle is idling, processing system 260 may combine the ohmic measurement information with vehicle operational status information (e.g., "engine idling") and a timestamp.

When the vehicle is not idling (block 625, No), process 600 may include checking for the current speed of the vehicle (block 640). For instance, processing system 260 may check the vehicle speed by receiving miles per hour (MPH), or kilometers per hour (KPH), information from telematics device 210. Process 600 may also include taking an ohmic measurements of vehicle battery 230 (block 645) and storing the ohmic measurement as a vehicle-moving ohmic value along with a timestamp (block 650). For instance, when the vehicle is moving, processing system 260 may combine the ohmic measurement information with vehicle operational status information (e.g., "vehicle moving"), the actual speed of the vehicle, and a timestamp in order to, for example, create an accurate picture of the time and context in which the ohmic measurement information was taken. Additionally, or alternatively "vehicle moving" may be substituted for the current speed of the vehicle taken at the time of the ohmic measurement.

At some point after storing an ohmic measurement with vehicle operational status information and a timestamp (blocks 620, 635, and 650), process 600 may continue to collect ohmic measurement information by returning to checking whether the vehicle is running (block 605) and following the process described above. As such, process 600 provides one of many possible examples of processing collected information by combining different types of information in order to create an accurate picture of vehicle battery 230.

Referring again to FIG. 5, process 500 may include communicating the data set to intelligence system 270 (block 530). The data set may assist intelligence system 270 in determining one or more aspects of vehicle battery health. In some implementations, the data set may be communicated to intelligence system 270 in response to creating the data set or in accordance with a pre-selected schedule. In some implementations, the data set may be communicated to intelligence system 270 in response to a request from intelligence system 270, which may include a request for only certain types of information included in the data set.

Figure 7:
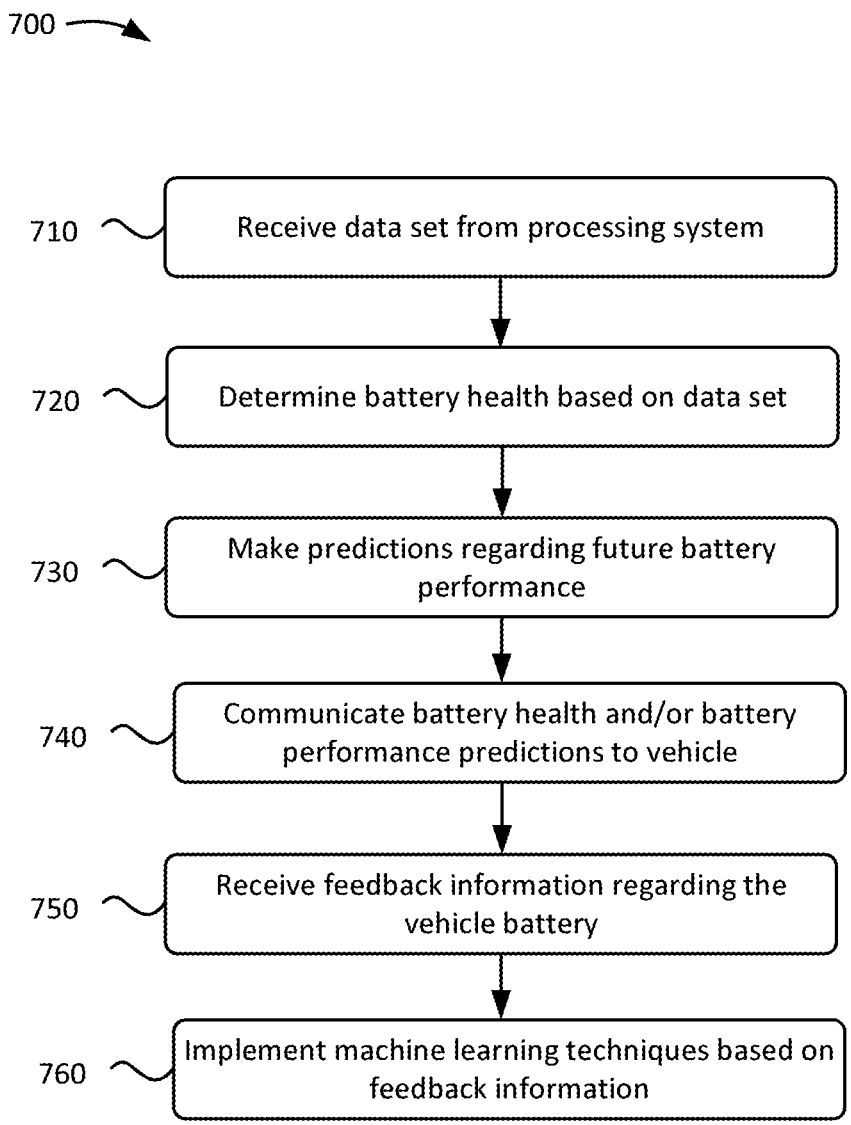
FIG. 7 is a flow chart illustrating an example process for determining the health of a vehicle battery.

FIG. 7 is a flow chart illustrating an example process 700 for determining the health of a vehicle battery. Process 700 may be implemented by intelligence system 270. In some implementations, one or more of the operations of process 700 may be performed by another device, such as telematics device 210 and/or processing system 260. For instance, as described below in more detail, in some implementations, intelligence system 270 may implement machine-learning techniques to produce a predictive model based on information from multiple vehicles, and telematics device 210 may use the model to predict battery life.

As shown, process 700 may include receiving a data set from processing system 260. As described above, the data set may include information that was collected by telematics device 210 and processed by processing system 260. The data set may include any combination of ohmic testing information, the vehicle information, the user device information, and the external information. In some implementations, ohmic testing information, vehicle information, and user device information may be received from processing system 260, and intelligence system 270 may retrieve external information by itself (e.g., in response to receiving the data set from processing system 260).

Process 700 may include determining the health of vehicle battery 230 based on the data set (block 720). For example, intelligence system 270 may determine the remaining battery life of vehicle battery 230 based on the data set received from processing system 260. In some implementations, intelligence system 270 may determine the health of vehicle battery 230 by comparing the information contained in the data set with historical information corresponding to other vehicle batteries (e.g., previous vehicle batteries installed in the vehicle and/or vehicle batteries installed in other vehicles). For instance, intelligence system 270 may identify an analogous data set (e.g., battery type, vehicle type, voltage measurements, ohmic measurements, failure date, etc.) corresponding to the vehicle battery of another vehicle and determine the remaining life of vehicle battery 230 based on the analogous data set. In addition, certain portions of the data set (e.g., the internal resistance, temperature, humidity, etc.) may be given greater weight than other portions of the data (e.g., voltage, geographic location, etc.) in determining future battery performance. In some implementations, intelligence system 270 may communicate with an external entity (e.g., a server of a manufacturer of vehicle battery 230, a server of a body shop that provided services to the vehicle, a server of a manufacturer of the vehicle, etc.) in order to, for example, enhance the data set received from processing server 260 and more accurately identify an analogous data set.

In some implementations, determining the health of vehicle battery 230 based on the data set may be performed by telematics device 210 instead of intelligence system 270. For instance, in some implementations, data sets corresponding to multiple vehicles in multiple environments may be collected by intelligence system 270, and intelligence system intelligence system 270 may implement machine-learning techniques on the data sets to train models (based on the collected data sets) to output the desired indication of battery health. Additionally, as more data continues to be received, the machine-learning techniques may be used to sometimes update/refine the models. The models may be communicated to telematics device 210, and telematics device 210 may use the models to evaluate the battery health without requiring constant network communications. In such implementations, information collected by telematics device 210 may not need to be constantly communicated to processing system 260 and/or intelligence system 270 because the latest model has been downloaded to the vehicle.

Process 700 may include making predictions regarding future battery performance (block 730). For example, intelligence system 270 may make predictions, regarding the future performance of vehicle battery 230, that may correspond to an internal resistance measurement, impedance calculation, or a voltage measurement at a particular time or under a particular set of conditions (e.g., at a particular time, temperature, humidity level, etc.). For example, intelligence system 270 may predict a voltage level of vehicle battery 230 at a future time while the vehicle is off, idling, or moving at a particular speed. In some implementations, some or all of the conditions relating to the predictions may correspond to a range of values, such as a range of times and dates, a range of temperatures, etc.

Intelligence system 270 may make the predictions by comparing information in the data set received from processing system 260 with information corresponding to analogous batteries, vehicles, and drivers. In some implementations, this may include the implementation of machine-learning techniques that enable intelligence system 270 to improve upon methodologies used to make predictions. The improvements may be derived from the information corresponding to the analogous batteries, vehicles, and drivers, and may enable intelligence system 270 to make predictive models based on the data set. As mentioned above, machine learning techniques that may be implemented by intelligence system 270 may include an ANN, Gaussian Processes Models, Support Vector Machines, Naïve Bayes Classifiers, K-Nearest Neighbor algorithms, Kernel methods, K-Means Clustering, Autoencoders (or Sparse Coding), and more.

Intelligence system 270 may make the predictions using a weighted algorithm that takes into account the relevance of different types of information in the data set. For instance, certain portions of the data set (e.g., the internal resistance, temperature, humidity, etc.) may be given greater weight than other portions of the data (e.g., voltage, geographic location, etc.) in determining future battery performance. As described below, making predictions regarding future battery performance may enable intelligence system 270 to receive feedback upon which enhancements may be made regarding the manner in which battery health is determined and future battery performance is predicted.

Process 700 may include communicating the battery health and battery performance predictions to the vehicle (block 740). For example, intelligence system 270 may notify the vehicle (and/or the driver of the vehicle) regarding the current health of battery 230 and/or predictions regarding the future performance of vehicle battery 230. In some implementations, intelligence system 270 may do so by communicating with telematics device 210, and telematics device 210 may relay some or all of the information to the driver via a media console of the vehicle or user device 240. The health of the battery may be additionally, or alternatively, communicated to other relevant parties, for example, the owner or operator of a vehicle fleet, a vehicle owner, an automotive dealership, or battery manufacturer.

Process 700 may include receiving feedback information regarding vehicle battery 230 (block 750). For instance, intelligence system 270 may receive feedback information, from telematics device 210, relating to the health of vehicle battery 230 (e.g., whether vehicle battery 230 has failed, the date and time of the failure, other information describing the conditions of the failure, etc.). Additionally, intelligence system 270 may receive feedback information, from telematics device 210, relating to one or more of the battery performance predictions made by intelligence system 270. For instance, if intelligence system 270 made a prediction that the internal resistance, voltage, or other aspects of vehicle battery 230 would be at a particular level by a certain date and under certain conditions (e.g., temperature, humidity, operational status of the vehicle, etc.), intelligence system 270 may receive feedback regarding those predictions when the specified conditions are met.

Process 760 may include implementing machine learning techniques based on the feedback information (block 760). For example, intelligence system 270 may use the feedback information to evaluate the accuracy of the methodologies or machine-learning techniques (e.g., comparisons with analogous data sets, weighted algorithms, etc.) used in determining battery health and/or predicting battery performance. Based on the evaluation, intelligence system 270 may confirm that the machine-learning techniques are sufficiently accurate or make changes to the machine-learning techniques in order to enhance the ability of intelligence system 270 to accurately determine battery health and/or make predictions regarding battery performance. In some implementations, intelligence system 270 may store the feedback information has historical data, along with the battery health information and the battery performance information previously generated by intelligence system 270. As mentioned above, machine learning techniques that may be implemented by intelligence system 270 may include an ANN, Gaussian Processes Models, Support Vector Machines, Naïve Bayes Classifiers, K-Nearest Neighbor algorithms, Kernel methods, K-Means Clustering, Autoencoders (or Sparse Coding), and more.

Figure 8:
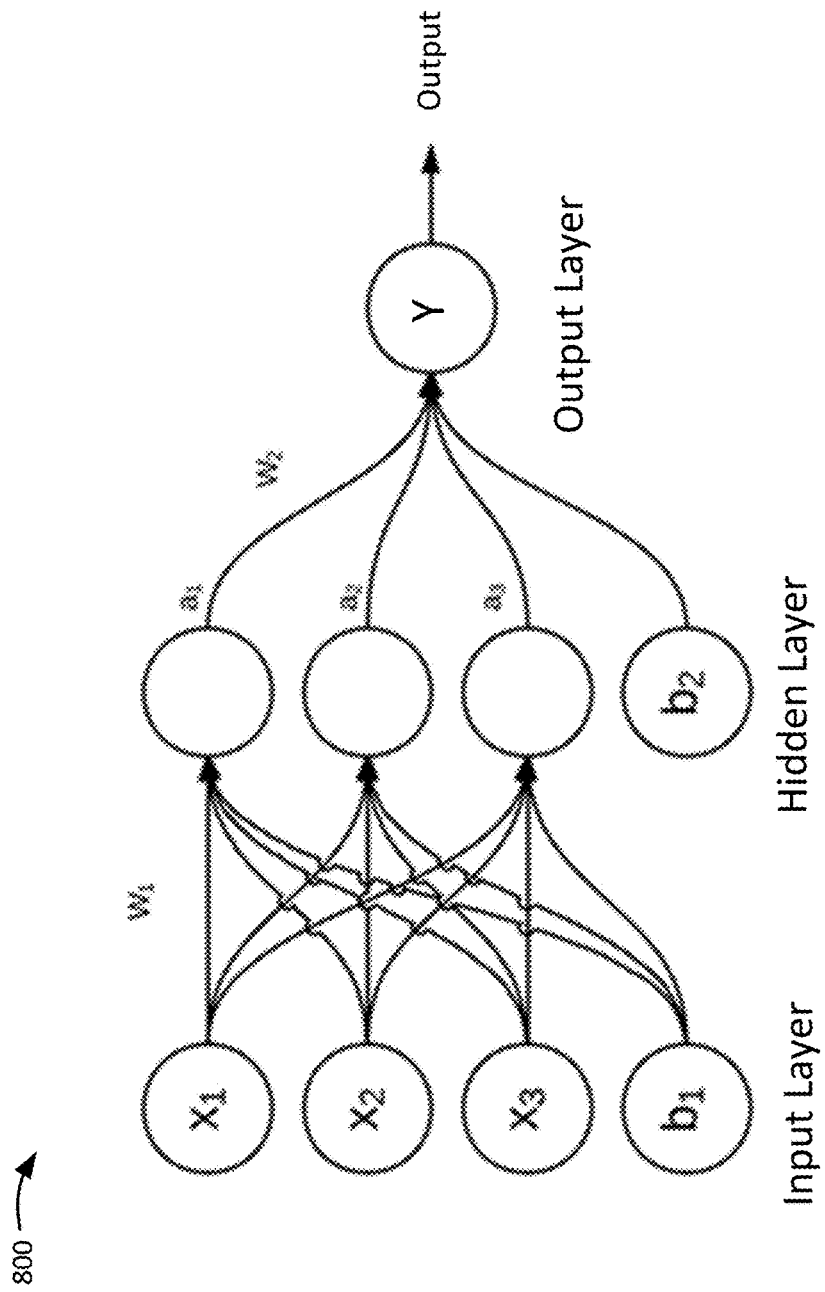
FIG. 8 is a diagram of an example artificial neural network (ANN) that may be implemented by an intelligence system.

FIG. 8 is a diagram of an example ANN 800 that may be implemented by intelligence system 270. As shown, ANN 800 may include an input layer of logical nodes ($x_1$, $x_2$, $x_3$, and $b_1$), a hidden layer of logical nodes ($a_1$, $a_2$, $a_3$, and $b_2$), and an output layer of one logical node (y). In some implementations, an ANN may have multiple layers of hidden logical nodes between the input layer and the output layer.

ANN 800 may include a training algorithm that modifies the connection strength between logically connected nodes in order to adapt to a particular set of training data that is input into the machine-learning algorithm. In terms of determining the health of vehicle battery 230, training data may include some or all of the information collected by telematics device 210 and processed by processing system 260 into a data set. Since the training data is intended to help ANN 800 learn the relationships between data, the training data may also include feedback information from telematics device 210, such as a date and time when the battery of a vehicle failed. As an example, the following table (Table I) provides an arrangement of training data, corresponding to three example vehicles (i.e., Vehicle 1, Vehicle 2, and Vehicle 3) that may be used to populate the logical nodes of the input and output layers of ANN 800.

Table I demonstrate that ANN 800 could include more input variables than just the three illustrated.

Each logical node in the hidden layer and the output layer sums all of the inputs flowing into the node and applies the result to an activation function (e.g., a sigmoid function) that may include a matrix of weighted factors (e.g., $w_1$ (a 3×3 matrix) or $w_2$ (a 3×1 matrix)) to apply to each input value in order to produce the corresponding output. The weight of each factor may start out as unknown and may be determined based on the training data (e.g., the known inputs (e.g., $x_1$, $x_2$, and $x_3$) and known output (e.g., y). Bias input values (e.g., $b_1$ and $b_2$) that are also factored into ANN 800 may also be learned in the training process using a back-propagation of errors approach that relies on, for example, minimizing cost functions (e.g., minimizing the difference between the predicted days until battery failure and the actual days until battery failure). Minimizing costs functions may involve a number of optimization techniques, such as stochastic algorithms or batch gradient descent algorithms. Regularization may also be used to address the possibility of overfitting (e.g., the risk that the machine-learning algorithm begins to describe random errors or noise in the training data instead of actual underlying relationships).

By using machine-learning techniques, intelligence system 270 may learn to make better predictions over time. Additionally, underlying connections between vehicle information, user information, or external information, and battery health may be established over time, diminishing or eliminating the need for ohmic measurements. For example, a subset of the population (e.g., 1000 vehicles) may be equipped with ohmic testing circuitry. The data from these vehicles may be used to determine patterns that may be used in the rest of the population to predict battery health without the need of ohmic testing information.

TABLE I

| | | Training Data | | |
| --- | --- | --- | --- | --- |
| Input | Variable | Vehicle 1 | Vehicle 2 | Vehicle 3 |
| Last 7 days ohmic measurement mean | $x_1$ | 514 S | 400 S | 701 S |
| Last 30 days ohmic measurement mean | $x_2$ | 600 S | 380 S | 890 S |
| Last 7 days ohmic measurement change | $x_3$ | +4 S | −20 S | +5 S |
| Last 30 days max temperature | $x_4$ | 78° F. | 65° F. | 44° F. |
| Last 30 days min temperature | $x_5$ | 58° F. | 55° F. | 21° F. |
| Average trip duration | $x_6$ | 39 m | 3 m | 48 min |
| Median latitude | $x_7$ | 33.7550° N | 34.4550° N | 32.3450° N |
| Median longitude | $x_8$ | 84.3900° W | 84.2300° W | 84.7600° W |
| Alternator mean voltage (when vehicle is on) | $x_9$ | 15.31 V | 14.8 V | 14.3 V |
| Days until cranking failure | y | 54 | 421 | 103 |

As provided in Table I, the training data includes an ohmic measurement mean over 7 days, an ohmic measurement mean over 30 days, an ohmic measurement slope over 7 days (which may represent a rate of change in the internal resistance within vehicle battery 230 over a time period), a maximum and a minimum temperature of, or near, the battery over 30 days, an average trip duration, a median latitude, a media longitude, a mean voltage of an alternator of the vehicle, and a number of days until cranking failure (e.g., the time when the vehicle failed to start due to a failure of vehicle battery 230). The table entries corresponding to ANN inputs are associated with input variables (e.g., $x_1$, $x_2$, $x_3$, etc.), whereas the table entry corresponding to the ANN output (e.g., the number of days until cranking failure) is associated with an output variable (e.g., y). Additionally, while ANN 800 includes only three input variables (e.g., $x_1$, $x_2$, and $x_3$) the eight input variables (e.g., $x_1$, $x_2$ . . . $x_8$) in In some implementations, hyperparameters (e.g., parameters that are not part of the training data) may be changed in an automated fashion or by human technicians. For instance, intelligence system 270 may implement ANN 800 using an ohmic measurement mean from the last 40 days, instead of the last 30 days as is the case in Table I. Hyperparameters may be adapted as more information becomes available, and may include more abstract concepts such as model selection, automated feature selection, and model blending.

Figure 9:
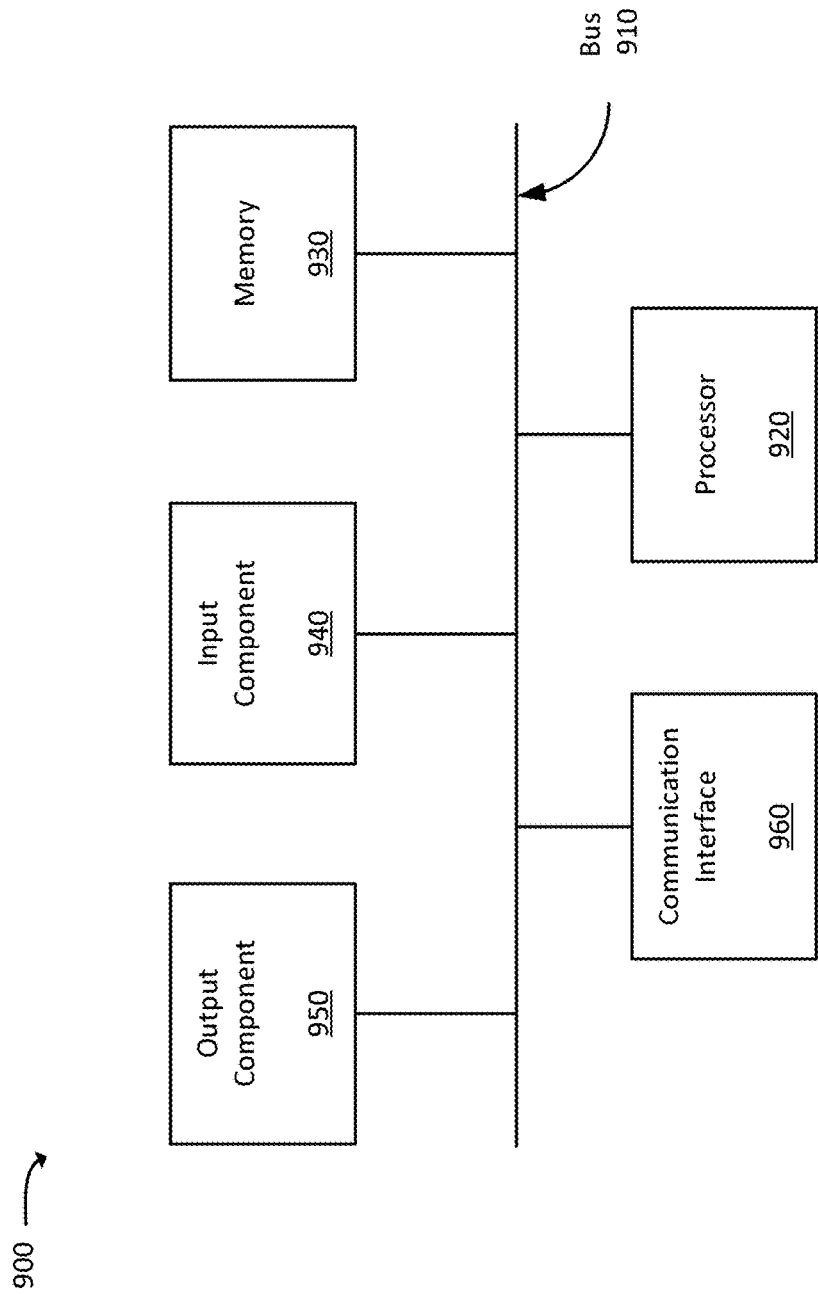
FIG. 9 is a diagram of example components of a device.

FIG. 9 is a diagram of example components of a device 900. Each of the devices illustrated in FIGS. 1 and 2 may include one or more devices 900. Device 900 may include bus 910, processor 920, memory 930, input component 940, output component 950, and communication interface 960. In another implementation, device 900 may include additional, fewer, different, or differently arranged components.

Bus 910 may include one or more communication paths that permit communication among the components of device 900. Processor 920 may include a processor, microprocessor, or processing logic that may interpret and execute instructions. Memory 930 may include any type of dynamic storage device that may store information and instructions for execution by processor 920, and/or any type of non-volatile storage device that may store information for use by processor 920.

Input component 940 may include a mechanism that permits an operator to input information to device 900, such as a keyboard, a keypad, a button, a switch, etc. Output component 950 may include a mechanism that outputs information to the operator, such as a display, a speaker, one or more light emitting diodes (LEDs), etc.

Communication interface 960 may include any transceiver-like mechanism that enables device 900 to communicate with other devices and/or systems. For example, communication interface 960 may include an Ethernet interface, an optical interface, a coaxial interface, or the like. Communication interface 960 may include a wireless communication device, such as an infrared (IR) receiver, a cellular radio, a Bluetooth radio, or the like. The wireless communication device may be coupled to an external device, such as a remote control, a wireless keyboard, a mobile telephone, etc. In some embodiments, device 900 may include more than one communication interface 960. For instance, device 900 may include an optical interface and an Ethernet interface.

Device 900 may perform certain operations described above. Device 900 may perform these operations in response to processor 920 executing software instructions stored in a computer-readable medium, such as memory 930. A computer-readable medium may be defined as a non-transitory memory device. A memory device may include space within a single physical memory device or spread across multiple physical memory devices. The software instructions may be read into memory 930 from another computer-readable medium or from another device. The software instructions stored in memory 930 may cause processor 920 to perform processes described herein. Alternatively, hardwired circuitry may be used in place of or in combination with software instructions to implement processes described herein. Thus, implementations described herein are not limited to any specific combination of hardware circuitry and software.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

For example, while a series of blocks have been described with regard to FIG. 4-7, the order of the blocks may be modified in other implementations. Further, non-dependent blocks may be performed in parallel. Similarly, while series of communications have been described with regard to FIGS. 1 and 2, the order or nature of the communications may potentially be modified in other implementations.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain portions of the invention may be implemented as "logic" that performs one or more functions. This logic may include hardware, such as an application-specific integrated circuit (ASIC) or a field-programmable gate array (FPGA), or a combination of hardware and software.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential unless explicitly described as such. An instance of the use of the term "and," as used herein, does not necessarily preclude the interpretation that the phrase "and/or" was intended in that instance. Similarly, an instance of the use of the term "or," as used herein, does not necessarily preclude the interpretation that the phrase "and/or" was intended in that instance. Also, as used herein, the article "a" is intended to include one or more items, and may be used interchangeably with the phrase "one or more." Where only one item is intended, the terms "one," "single," "only," or similar language is used. Further, the phrase "based on" is intended to mean "based, at least in part, on" unless explicitly stated otherwise.

What is claimed is:

1. A method performed by one or more computing devices, comprising:
   receiving, by the one or more computing devices, information corresponding to internal resistances of a battery of a vehicle;
   receiving, by the one or more computing devices, information corresponding to at least one other operating condition, in addition to the internal resistances, corresponding to the vehicle;
   receiving, by the one or more computing devices, information corresponding to an identity of a driver of the vehicle, the information originating from a mobile user device associated with the driver;
   determining, by the one or more computing devices and based on the identity, driving habits that are based on historic driving data associated with the driver;
   receiving, by the one or more computing devices, a machine learning model that was trained, over time, based on internal resistances of a plurality of vehicles, other operating conditions of the plurality of vehicles, and driving habits of a plurality of drivers associated with the plurality of vehicles;
   evaluating, by the one or more computing devices, the machine learning model based on the internal resistances of the battery of the vehicle, the at least one other operating condition, and the driving habits of the driver to produce a prediction regarding the remaining battery life;
   presenting, by the one or more computing devices and via a display device associated with the vehicle, the prediction regarding the remaining battery life; and
   refining, by the one or more computing devices, the machine learning model based on the internal resistances of the battery of the vehicle, the operating condition corresponding to the vehicle, and the driving habits of the driver of the vehicle, wherein the refined machine learning model is subsequently used in a prediction of remaining battery life of a battery of another vehicle.

2. The method of claim 1, wherein the other operating condition includes at least one of:
a humidity measurement,
a temperature measurement,
a range of humidity levels over a period of time,
a range of temperatures over a period of time,
voltage readings with the vehicle off versus on,
a coolant temperature minimum,
a coolant temperature maximum,
a coolant temperature average,
a barometric pressure surrounding the battery.

3. The method of claim 1, wherein the one or more computing devices include a telematics device installed in the vehicle.

4. The method of claim 1, wherein the internal resistances of the battery are derived from an ohmic testing device electrically coupled to the battery.

5. The method of claim 1, wherein evaluating the prediction regarding the remaining battery life comprises:
accessing historical operating conditions of the battery; and
predicting the remaining battery life of the battery based on the internal resistances of the battery, the at least one other operating condition, the driving habits of the driver, and the historical operating conditions of the battery.

6. The method of claim 1, further comprising:
receiving feedback regarding the accuracy of the prediction;
further refining the machine learning model based on the feedback.

7. The method of claim 1, further comprising:
determining, based on another model, at least one other prediction regarding a future performance of the battery;
providing, to a server device, feedback regarding the accuracy of the at least one other prediction; and
receiving an updated version of the other model in response to providing the feedback to the server device.

8. One or more computing devices comprising:
a non-transitory memory device storing a plurality of processor-executable instructions; and
a processor configured to execute the processor-executable instructions, wherein executing the processor-executable instructions causes the processor to:
receive information corresponding to internal resistances of a battery of a vehicle;
receive information corresponding to at least one other operating condition, in addition to the internal resistances, corresponding to the vehicle;
receive information corresponding to an identity of a driver of the vehicle, the information originating from a mobile user device associated with the driver;
determine driving habits that are based on historic driving data associated with the driver;
receive a machine learning model that was trained, over time, on internal resistances of a plurality of vehicles, other operating conditions of the plurality of vehicles, and driving habits of a plurality of drivers associated with the plurality of vehicles;
evaluate the model based on the internal resistances of the battery of the vehicle and the at least one other operating condition, and the driving habits of the driver to produce a prediction regarding the remaining battery life;
communicate the prediction, regarding the remaining battery life, to a component of the vehicle; and
refine the machine learning model based on the internal resistances of the battery of the vehicle, the operating condition corresponding to the vehicle, and the driving habits of the driver of the vehicle, wherein the refined machine learning model is subsequently used in a prediction of remaining battery life of a battery of another vehicle.

9. The one or more devices of claim 8, wherein the other operating condition includes at least one of:
measurements of the internal resistance measurements that are made when the engine of the vehicle is off;
measurements of the internal resistance measurements that are made when the engine of the vehicle is idle, and
measurements of the internal resistance measurements that are made when the engine of the vehicle is moving.

10. The one or more devices of claim 8, wherein the one or more computing devices include a telematics device installed in the vehicle.

11. The one or more devices of claim 8, wherein the internal resistances of the battery are derived from an ohmic testing device that is built into the battery.

12. The one or more devices of claim 8, wherein, to evaluate the prediction regarding the remaining battery life, the circuitry is to:
access historical operating conditions of the battery; and
predict the remaining battery life of the battery based on the internal resistances of the battery, the at least one other operating condition, and the historical operating conditions of the battery.

13. The one or more devices of claim 8, wherein the circuitry is further to:
receive feedback regarding the accuracy of the prediction;
further refine the machine learning model based on the feedback.

14. The one or more devices of claim 8, wherein the circuitry is further to:
determine, based on another model, at least one other prediction regarding a future performance of the battery;
provide, to a server device, feedback regarding the accuracy of the at least one other prediction; and
receive an updated version of the other model in response to providing the feedback to the server device.

15. One or more computing devices, comprising:
a non-transitory memory device storing a plurality of processor-executable instructions; and
a processor configured to execute the processor-executable instructions, wherein executing the processor-executable instructions causes the processor to:
receive measurements of internal resistances of batteries installed at a plurality of vehicles;
receive measurements of other operating conditions, in addition to the internal resistances, relating to the plurality of vehicles;
receive information corresponding to identities of a plurality of drivers for the plurality of vehicles, vehicle the information originating from mobile user devices of the drivers;
determining driving habits based on historic driving data associated with the drivers;
train models over time, using machine learning techniques and based on the measurements of the internal resistances of batteries installed at the plurality of vehicles, the measurements of the other operating conditions, and the driving habits of the plurality of drivers, to predict battery failure in the plurality of vehicles,
wherein training the models over time includes modifying the models over time based on:
the measurements of internal resistances of batteries installed at a plurality of vehicle,
the other operating conditions relating to the plurality of vehicles, and
the driving habits of the plurality of drivers; and
transmit at least one trained model, of the trained models, to the plurality of vehicles, for prediction of battery failure at the plurality of vehicles.

16. The one or more computing device of claim 15, wherein the information defining one or more of the other operating conditions includes at least one of:
a make and a model of the battery,
a battery type,
cold cranking amps (CCAs) corresponding to the battery,
conductance measurements paired with other battery or automotive data,
a total number of trips associated with the battery,
a humidity measurement,
a temperature measurement,
a range of humidity levels over a period of time,
a range of temperatures over a period of time,
voltage readings with the vehicle off versus on,
a total number of vehicle starts corresponding to the battery,
needed amperage for the make and the model of the battery,
cold resets corresponding to the battery,
a minimum trip mileage,
a maximum trip mileage,
an average trip mileage,
a float voltage minimum,
a float voltage maximum,
a float voltage average,
a coolant temperature minimum,
a coolant temperature maximum,
a coolant temperature average,
a ride time corresponding to one or more trips,
a geographical location of the vehicle,
an engine load of the vehicle,
revolutions per minute corresponding to the vehicle,
a speed of the vehicle,
a temperature of the vehicle at a start of the trip,
variation of voltage over time,
a driving style associated with the vehicle or the driver of the vehicle,
differences between periodic voltage readings,
differences between periodic conductance readings or statistical derivations of measurement corresponding to a sensor of device of the vehicle,
a barometric pressure surrounding the battery,
an acceleration of the vehicle,
a duration between an installation date of the battery and a current date,
a manufacture date of the battery,
measurements of the internal resistance measurements that are made when the engine of the vehicle is off,
measurements of the internal resistance measurements that are made when the engine of the vehicle is idle,
measurements of the internal resistance measurements that are made when the engine of the vehicle is moving,
records of service corresponding to the battery, or
records of services corresponding to the vehicle.

17. The one or more computing device of claim 15, wherein:
the one or more computing devices comprises at least one server device, and
the information corresponding to the internal resistances of the batteries and the one or more other operating conditions are received, by the at least one server device and via a wireless telecommunications network, from the plurality of vehicles.

18. The one or more computing device of claim 15, wherein the internal resistances of the batteries are derived from ohmic testing devices electrically coupled to the batteries.

19. The one or more computing device of claim 18, wherein:
the information corresponding to the internal resistances of the batteries and the one or more other operating conditions are received, via a wireless telecommunications network, from telematics device installed in the plurality of vehicles.

20. The one or more computing device of claim 15, wherein executing the processor-executable instructions causes the processor to:
receive feedback regarding a particular prediction of battery failure of a particular vehicle;
determine a level of accuracy regarding the particular prediction based on the feedback;
further update the trained model used to predict the battery failure based on the level of accuracy regarding the prediction; and
transmit the updated trained model, to the plurality of vehicles, for prediction of battery failures at the plurality of vehicles.

* * * * *